(12) United States Patent
Wang (10) Patent No.: US 10,757,825 B2
(45) Date of Patent: Aug. 25, 2020

(54) TERMINAL AND METHOD FOR ASSEMBLING COLLECTION MODULE OF TERMINAL

(71) Applicant: Huawei Technologies Co., Ltd., Shenzhen (CN)

(72) Inventor: Zhimin Wang, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/090,455

(22) PCT Filed: Apr. 5, 2016

(86) PCT No.: PCT/CN2016/078494
§ 371 (c)(1),
(2) Date: Oct. 1, 2018

(87) PCT Pub. No.: WO2017/173580
PCT Pub. Date: Oct. 12, 2017

(65) Prior Publication Data
US 2019/0320540 A1    Oct. 17, 2019

(51) Int. Cl.
*H05K 5/02* (2006.01)
*H05K 5/03* (2006.01)
*H05K 5/04* (2006.01)

(52) U.S. Cl.
CPC ......... *H05K 5/0204* (2013.01); *H05K 5/0243* (2013.01); *H05K 5/03* (2013.01); *H05K 5/04* (2013.01)

(58) Field of Classification Search
CPC ..... H01Q 1/243; G06F 1/1626; G06F 1/1698; G06F 1/1613; G06F 1/1658; G06F 1/16;
(Continued)

(56) References Cited

U.S. PATENT DOCUMENTS

| 2003/0179229 A1* | 9/2003 | Van Erlach ........... G06F 1/1626 715/744 |
| 2006/0034499 A1 | 2/2006 | Shinoda et al. |

(Continued)

FOREIGN PATENT DOCUMENTS

| CN | 202076345 U | 12/2011 |
| CN | 202617252 U | 12/2012 |

(Continued)

OTHER PUBLICATIONS

Machine Translation and Abstract of Chinese Publication No. CN103312840, dated Sep. 18, 2013, 10 pages.

(Continued)

*Primary Examiner* — Abhishek M Rathod
(74) *Attorney, Agent, or Firm* — Conley Rose, P.C.

(57) ABSTRACT

A terminal and a method for assembling a collection circuit of a terminal. The collection circuit is attached to an inside of a metal supporting frame, and the metal supporting frame is attached to a rear housing of the terminal. In this way, the collection circuit does not need to be disposed on a battery cover, and is supported by the metal supporting frame. This resolves a problem that a press support failure occurs when the collection circuit is used. Moreover, attaching the collection circuit and the metal supporting frame to the rear housing belongs to level 2 appearance assembly. This resolves a problem in level 1 appearance assembly that a minor scratch on the battery cover may ruin a fingerprint recognition circuit. Assembly of the entire collection circuit is simple and cost effective.

17 Claims, 3 Drawing Sheets

(58) Field of Classification Search
CPC .... G06K 9/00013; G06K 9/00; H05K 5/0204; H05K 5/04; H05K 5/03; H05K 5/0243; H04M 1/02
See application file for complete search history.

(56) References Cited

U.S. PATENT DOCUMENTS

| | | | |
|---|---|---|---|
| 2006/0046842 A1* | 3/2006 | Mattice | G06Q 20/3433 463/29 |
| 2011/0041553 A1* | 2/2011 | Xiong | B23K 1/0008 63/1.12 |
| 2011/0048754 A1* | 3/2011 | Xiong | C23C 26/00 174/50 |
| 2011/0287812 A1 | 11/2011 | Joo | |
| 2012/0050114 A1 | 3/2012 | Li et al. | |
| 2013/0106662 A1* | 5/2013 | Ishida | H01Q 1/44 343/702 |
| 2013/0170159 A1 | 7/2013 | Jiang | |
| 2013/0184032 A1 | 7/2013 | Choi et al. | |
| 2014/0071022 A1 | 3/2014 | Na | |
| 2014/0111920 A1* | 4/2014 | Takita | H05K 5/069 361/679.01 |
| 2014/0198010 A1* | 7/2014 | Cheng | H01Q 7/00 343/866 |
| 2014/0367369 A1* | 12/2014 | Nashner | B41M 5/24 219/121.66 |
| 2015/0054692 A1 | 2/2015 | Choi et al. | |
| 2015/0169934 A1* | 6/2015 | Tsai | G06K 9/00033 382/115 |
| 2015/0220115 A1 | 8/2015 | Gao et al. | |
| 2015/0245514 A1 | 8/2015 | Choung et al. | |
| 2016/0088128 A1* | 3/2016 | Chang | B32B 7/05 455/575.1 |
| 2016/0088130 A1 | 3/2016 | Jung et al. | |
| 2016/0253540 A1 | 9/2016 | Han et al. | |

FOREIGN PATENT DOCUMENTS

| | | |
|---|---|---|
| CN | 103209229 A | 7/2013 |
| CN | 103312840 A | 9/2013 |
| CN | 103747641 A | 4/2014 |
| CN | 203522877 U | 4/2014 |
| CN | 104408434 A | 3/2015 |
| CN | 104967707 A | 10/2015 |
| CN | 204719771 U | 10/2015 |
| CN | 204791054 U | 11/2015 |
| CN | 205071070 U | 3/2016 |
| JP | 2013537776 A | 10/2013 |
| JP | 2014160165 A | 9/2014 |
| JP | 2015215683 A | 12/2015 |
| KR | 20130083237 A | 7/2013 |
| WO | 2004093008 A1 | 10/2004 |
| WO | 2009078084 A1 | 6/2009 |
| WO | 2015192522 A1 | 12/2015 |

OTHER PUBLICATIONS

Machine Translation and Abstract of Chinese Publication No. CN104408434, dated Mar. 11, 2015, 23 pages.
Foreign Communication From A Counterpart Application, Chinese Application No. 201680025076.7, Chinese Office Action dated May 5, 2019, 7 pages.
Machine Translation and Abstract of Chinese Publication No. CN104967707, dated Oct. 7, 2015, 12 pages.
Machine Translation and Abstract of Chinese Publication No. CN202076345, dated Dec. 14, 2011, 8 pages.
Machine Translation and Abstract of Chinese Publication No. CN202617252, dated Dec. 19, 2012, 18 pages.
Machine Translation and Abstract of Chinese Publication No. CN204719771, dated Oct. 21, 2015, 9 pages.
Machine Translation and Abstract of Chinese Publication No. CN205071070, dated Mar. 2, 2016, 7 pages.
Machine Translation and Abstract of International Publication No. WO2009078084, dated Jun. 25, 2009, 8 pages.
Foreign Communication From A Counterpart Application, European Application No. 16897515.9, Extended European Search Report dated Jan. 2, 2019, 7 pages.
Foreign Communication From A Counterpart Application, PCT Application No. PCT/CN2016/078494, English Translation of International Search Report dated Jan. 5, 2017, 3 pages.
Foreign Communication From A Counterpart Application, PCT Application No. PCT/CN2016/078494, English Translation of Written Opinion dated Jan. 5, 2017, 8 pages.
Machine Translation and Abstract of Chinese Publication No. CN204791054, dated Nov. 18, 2015, 11 pages.
Foreign Communication From A Counterpart Application, Chinese Application No. 201680025076.7, Chinese Office Action dated Dec. 3, 2019, 8 pages.
Machine Translation and Abstract of Japanese Publication No. JP2015215683, dated Dec. 3, 2015, 22 pages.
Machine Translation and Abstract of International Publication No. WO2004093008, dated Oct. 28, 2004, 20 pages.
Foreign Communication From A Counterpart Application, Japanese Application No. 2018-541652, Japanese Office Action dated Sep. 3, 2019, 3 pages.
Foreign Communication From A Counterpart Application, Japanese Application No. 2018-541652, English Translation of Japanese Office Action dated Sep. 3, 2019, 5 pages.

\* cited by examiner

TERMINAL AND METHOD FOR ASSEMBLING COLLECTION MODULE OF TERMINAL

CROSS-REFERENCE TO RELATED APPLICATIONS

This application is a U.S. National Stage of International Patent Application No. PCT/CN2016/078494 filed on Apr. 5, 2016, which is hereby incorporated by reference in its entirety.

TECHNICAL FIELD

The present invention relates to the field of terminal assembly technologies, and in particular, to a terminal and a method for assembling a collection module of a terminal.

BACKGROUND

Figure 1:
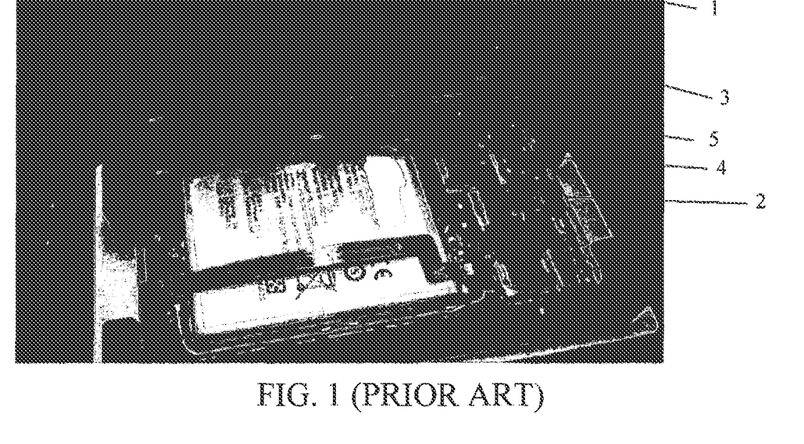
FIG. 1 is a schematic diagram of prior-art assembly of a collection module.

With development of intelligent terminal technologies, currently, a collection module is usually disposed to collect an external parameter, bringing richer experience to a user. For the collection modules, such as fingerprint recognition modules, some are assembled on a front side of terminals and some are assembled on a back side of terminals. For a fingerprint recognition module assembled on a front side of a terminal, an assembly manner is complex. For a fingerprint recognition module assembled on a back side of a terminal, refer to FIG. 1. FIG. 1 is a schematic diagram of assembly of a collection module. A fingerprint recognition module 3 is fastened onto a battery cover 1. Before the battery cover 1 is assembled, a board to board connector (BTB) on a flexible printed circuit (FPC) 5 of the fingerprint recognition module 3 needs to be snap-fitted to a BTB connector 4 on a main board 2. In this case, a quite long FPC needs to be designed to facilitate assembly, and costs are relatively high. Moreover, the connectors are snap-fitted when the battery cover 1 is being assembled, and the FPC 5 is easily faulty due to being pulled during the assembly. Because the fingerprint recognition module 3 is fastened onto the battery cover 1, it is inevitable that the fingerprint recognition module 3 is deformed or is not fully laminated to the battery cover 1, and a press support failure occurs when the fingerprint recognition module 3 is being used. Fastening the fingerprint recognition module 3 onto the battery cover 1 belongs to level 1 appearance assembly, and a minor scratch on the battery cover 1 may ruin the fingerprint recognition module 3.

SUMMARY

Embodiments of the present invention provide a terminal and a method for assembling a collection module of a terminal, so as to resolve the following problems: Assembly of the collection module is complex, costs are high, a press support failure occurs when the collection module is being used, and a minor scratch on a battery cover may ruin a fingerprint recognition module.

According to one aspect, a terminal is provided, where the terminal includes a front housing, a rear housing and a battery cover that are snap-fitted to the front housing in sequence, and a main board assembled onto the front housing; and the terminal further includes a metal supporting frame attached to the rear housing and a collection module attached inside the metal supporting frame, where the collection module and the main board are electrically connected, the battery cover has a hole, a collection surface of the collection module is exposed from the battery cover through the hole, and the collection module is configured to collect an external parameter.

In this implementation, the collection module is attached inside the metal supporting frame, and the metal supporting frame is attached to the rear housing of the terminal. In this way, the collection module does not need to be assembled onto the battery cover, and is supported by the metal supporting frame. This resolves a problem that a press support failure occurs when the collection module is being used. Moreover, attaching the collection module and the metal supporting frame to the rear housing belongs to level 2 appearance assembly. This resolves a problem in level 1 appearance assembly that a minor scratch on the battery cover may ruin a fingerprint recognition module. Assembly of the entire collection module is simple and costs little.

With reference to the first aspect, in a first possible implementation of the first aspect, the battery cover is a non-metal battery cover.

In this implementation, a non-metal battery cover may be used, effectively reducing production costs.

With reference to the first aspect or the first possible implementation of the first aspect, in a second possible implementation of the first aspect, the metal supporting frame is attached to a side of the rear housing facing the main board.

In this implementation, the rear housing may be located on top of the metal supporting frame, and the metal supporting frame provides a support function.

With reference to the first aspect or the first possible implementation of the first aspect, in a third possible implementation of the first aspect, the metal supporting frame is attached to a side of the rear housing facing the battery cover.

In this implementation, the rear housing may be located under the metal supporting frame, and the metal supporting frame also provides a support function.

With reference to the first aspect, the first possible implementation of the first aspect, the second possible implementation of the first aspect, or the third possible implementation of the first aspect, in a fourth possible implementation of the first aspect, the rear housing further includes a metal ornament located between the collection module and the hole.

In this implementation, the metal ornament provides support and decoration functions.

With reference to the first aspect, the first possible implementation of the first aspect, the second possible implementation of the first aspect, the third possible implementation of the first aspect, or the fourth possible implementation of the first aspect, in a fifth possible implementation of the first aspect, the collection module includes a fingerprint recognition module, a camera module, an infrared scanning module, and a laser module.

According to another aspect, a method for assembling a collection module of a terminal is provided, where the terminal includes a front housing, a rear housing and a battery cover that are snap-fitted to the front housing in sequence, and a main board assembled onto the front housing; the terminal further includes a metal supporting frame and the collection module, and the collection module is configured to collect an external parameter; and the assembly method includes: attaching the collection module inside the metal supporting frame; attaching the metal supporting frame to the rear housing; electrically connecting the collection module to the main board; and snap-fitting the battery cover, so that a collection surface of the collection module is exposed from the battery cover through a hole on the battery cover.

With reference to the second aspect, in a first implementation of the second aspect, the battery cover is a non-metal battery cover.

With reference to the second aspect or the first possible implementation of the second aspect, in a second possible implementation of the second aspect, the attaching the metal supporting frame to the rear housing includes: attaching the metal supporting frame to a side of the rear housing facing the main board.

With reference to the second aspect or the first possible implementation of the second aspect, in a third possible implementation of the second aspect, the attaching the metal supporting frame to the rear housing includes: attaching the metal supporting frame to a side of the rear housing facing the battery cover.

With reference to the second aspect, the first possible implementation of the second aspect, the second possible implementation of the second aspect, or the third possible implementation of the second aspect, in a fourth possible implementation of the second aspect, the assembly method further includes: disposing a metal ornament between the collection module and the hole.

With reference to the second aspect, the first possible implementation of the second aspect, the second possible implementation of the second aspect, the third possible implementation of the second aspect, or the fourth possible implementation of the second aspect, in a fifth possible implementation of the second aspect, the collection module includes a fingerprint recognition module, a camera module, an infrared scanning module, and a laser module.

Implementing the terminal and the method for assembling a collection module of a terminal provided in the embodiments of the present invention has the following beneficial effects:

The collection module is attached inside the metal supporting frame, and the metal supporting frame is attached to the rear housing of the terminal. In this way, the collection module does not need to be assembled onto the battery cover, and is supported by the metal supporting frame. This resolves the problem that a press support failure occurs when the collection module is being used. Moreover, attaching the collection module and the metal supporting frame to the rear housing belongs to level 2 appearance assembly. This resolves the problem in level 1 appearance assembly that a minor scratch on the battery cover may ruin the fingerprint recognition module. Assembly of the entire collection module is simple and costs little.

BRIEF DESCRIPTION OF DRAWINGS

To describe the technical solutions in the embodiments of the present invention or in the prior art more clearly, the following briefly describes the accompanying drawings required for describing the embodiments. Apparently, the accompanying drawings in the following descriptions show merely some embodiments of the present invention, and a person of ordinary skill in the art may still derive other drawings from these accompanying drawings without creative efforts.

DESCRIPTION OF EMBODIMENTS

The embodiments of the present invention provide a terminal and a method for assembling a collection module of a terminal. The collection module is attached inside a metal supporting frame, and the metal supporting frame is attached to a rear housing of the terminal. In this way, the collection module does not need to be assembled onto a battery cover, and is supported by the metal supporting frame. This resolves a problem that a press support failure occurs when the collection module is being used. Moreover, attaching the collection module and the metal supporting frame to the rear housing belongs to level 2 appearance assembly. This resolves a problem in level 1 appearance assembly that a minor scratch on the battery cover may ruin a fingerprint recognition module. Assembly of the entire collection module is simple and costs little.

A terminal in this embodiment may be a portable terminal, such as a mobile phone or a tablet. Generally, the terminal includes a front housing, a rear housing and a battery cover that are snap-fitted to the front housing in sequence, and a main board assembled onto the front housing. In this embodiment, the terminal further includes a metal supporting frame attached to the rear housing and a collection module attached inside the metal supporting frame. The collection module and the main board are electrically connected. The battery cover has a hole. A collection surface of the collection module is exposed from the battery cover through the hole. The collection module is configured to collect an external parameter.

Various electronic parts and components of the terminal are arranged on the main board, and the main board is connected to a battery by using a BTB connector. The collection module is connected to the battery and a control module on the main board, so as to obtain power from the battery, collect an external parameter according to an instruction of the control module, and return the external parameter to the control module.

In this embodiment, a first hole for accommodating the collection module is provided on the metal supporting frame. During assembly, the collection module is placed into the first hole and attached. The collection surface of the collection module for collecting an external parameter faces the battery cover. A second hole is provided on the battery cover. The collection surface of the collection module for collecting an external parameter is exposed from the battery cover through the second hole. The collection module may be on a same level as the battery cover or slightly higher than the battery cover. The metal supporting frame may be a steel supporting frame or a supporting frame made of another metal material. The metal supporting frame has good support. Using the metal supporting frame to support the collection module avoids a problem that a press support failure occurs when the collection module is being used.

In this embodiment, the collection module is assembled onto the rear housing instead of the battery cover. Attaching the collection module and the metal supporting frame to the rear housing belongs to level 2 appearance assembly. This resolves a problem in level 1 appearance assembly that a minor scratch on the battery cover may ruin a fingerprint recognition module. Assembly of the entire collection module is simple and costs little.

Preferably, the battery cover is a non-metal battery cover, for example, a plastic battery cover. With the support of the metal supporting frame, using the plastic battery cover does not lead to the problem that a press support failure occurs when the collection module is being used. Moreover, using the plastic battery cover reduces fabrication costs of the terminal and reduces a weight of the terminal.

Preferably, the collection module includes a fingerprint recognition module, a camera module, an infrared scanning module, and a laser module.

Further, a metal ornament may further be disposed between the collection module and the second hole, that is, the metal ornament is filled between the collection module and the second hole on the battery cover, for supporting the collection module and for decoration.

Figure 2:
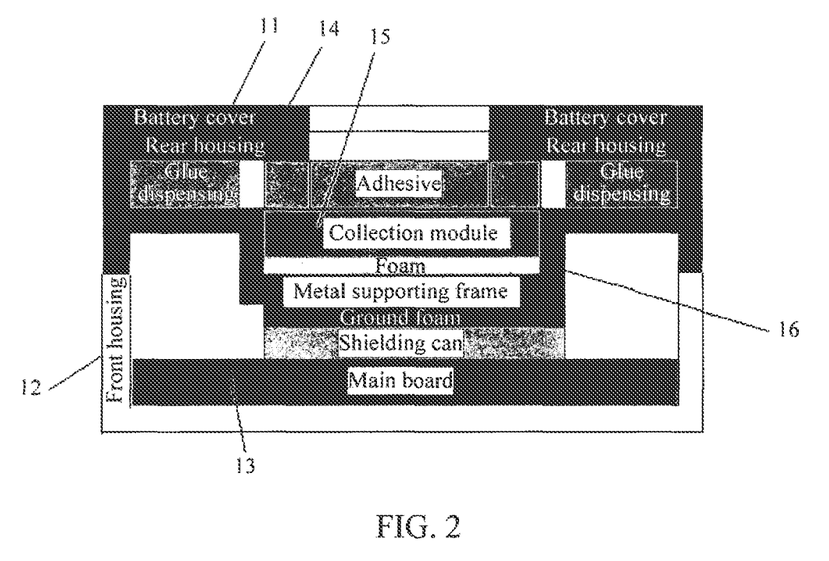
FIG. 2 is a schematic diagram of assembly of a collection module according to an embodiment of the present invention.

The following uses two specific examples to describe assembly of the collection module:

FIG. 2 is a schematic diagram of assembly of a collection module according to an embodiment of the present invention. In FIG. 2, a collection module 15 is attached to a metal supporting frame 16, and then assembled to a rear housing 14 by means of attaching, and the three components form an assembly. A main board 13 is assembled to a front housing 12, the collection module 15 and the main board 13 are electrically connected by using a BTB connector, and then, the assembly made up of the collection module 15, the metal supporting frame 16, and the rear housing 14 is assembled to the main board. Finally, the rear housing 14 and the front housing 12 are pre-positioned by using a clip and then positioned by using a screw. The rear housing 14 and a battery cover 11 each have a hole. A collection surface of the collection module 15 is exposed from a terminal through the holes of the rear housing 14 and the battery cover 11.

In FIG. 2, the metal supporting frame 16 is attached to a side of the rear housing 14 facing the main board 13, that is, the rear housing 14 is located on top of the metal supporting frame 16.

Glue dispensing or glue adhesion may be used for attaching the rear housing 14 and the metal supporting frame 16. The collection module 15 may be attached to the metal supporting frame 16 by using an adhesive. Foam may also be filled between the collection module 15 and the metal supporting frame 16. Ground foam and a shielding can may be filled between the metal supporting frame 16 and the main board 13. The foam provides functions of sealing and resistance against water and moisture.

Figure 3:
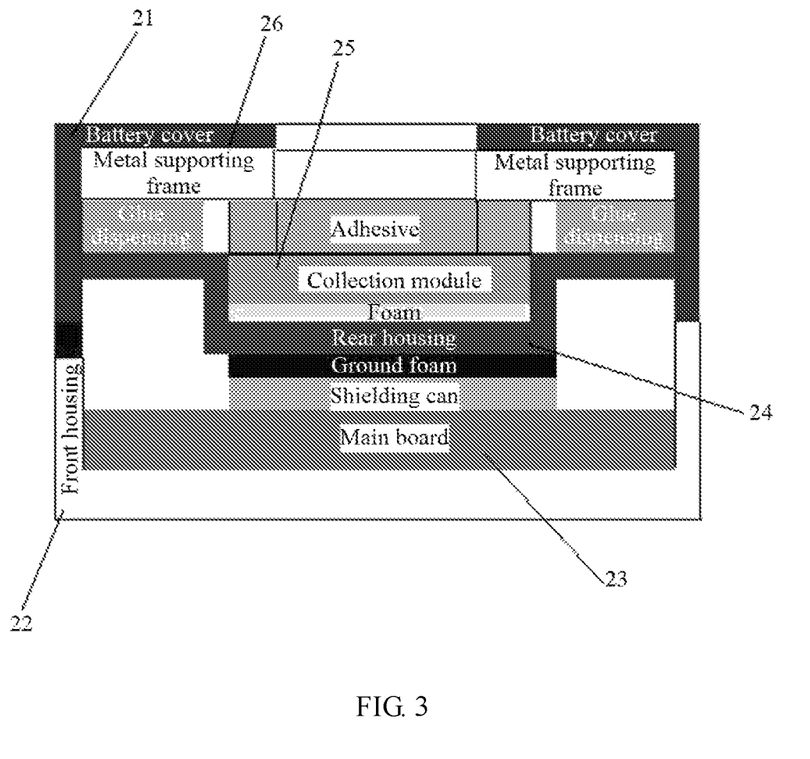
FIG. 3 is a schematic diagram of another assembly of a collection module according to an embodiment of the present invention.

FIG. 3 is a schematic diagram of another assembly of a collection module according to an embodiment of the present invention. In FIG. 3, a collection module 25 is attached to a metal supporting frame 26, and then assembled to a rear housing 24 by means of attaching, and the three components form an assembly. A main board 23 is assembled to a front housing 22, the collection module 25 and the main board 23 are electrically connected by using a BTB connector, and then, the assembly made up of the collection module 25, the metal supporting frame 26, and the rear housing 24 is assembled to the main board 23. The rear housing 24 and the front housing 22 are pre-positioned by using a clip and then positioned by using a screw.

A battery cover 21 has a hole. A collection surface of the collection module 25 is exposed from the battery cover 21 through the hole of the battery cover 21.

In FIG. 3, the metal supporting frame 26 is attached to a side of the rear housing 24 facing the battery cover 21, that is, the rear housing 24 is located under the metal supporting frame 26.

Glue dispensing or glue adhesion may be used for attaching the rear housing 24 and the metal supporting frame 26. The collection module 25 may be attached to the metal supporting frame 26 by using an adhesive. Foam may also be filled between the collection module 25 and the metal supporting frame 26. Ground foam and a shielding can may be filled between the rear housing 24 and the main board 23. The foam provides functions of sealing and resistance against water and moisture.

According to the terminal provided in this embodiment of the present invention, the collection module is attached inside the metal supporting frame, and the metal supporting frame is attached to the rear housing of the terminal. In this way, the collection module does not need to be assembled onto the battery cover, and is supported by the metal supporting frame. This resolves the problem that a press support failure occurs when the collection module is being used. Moreover, attaching the collection module and the metal supporting frame to the rear housing belongs to level 2 appearance assembly. This resolves the problem in level 1 appearance assembly that a minor scratch on the battery cover may ruin the fingerprint recognition module. Assembly of the entire collection module is simple and costs little.

Figure 4:
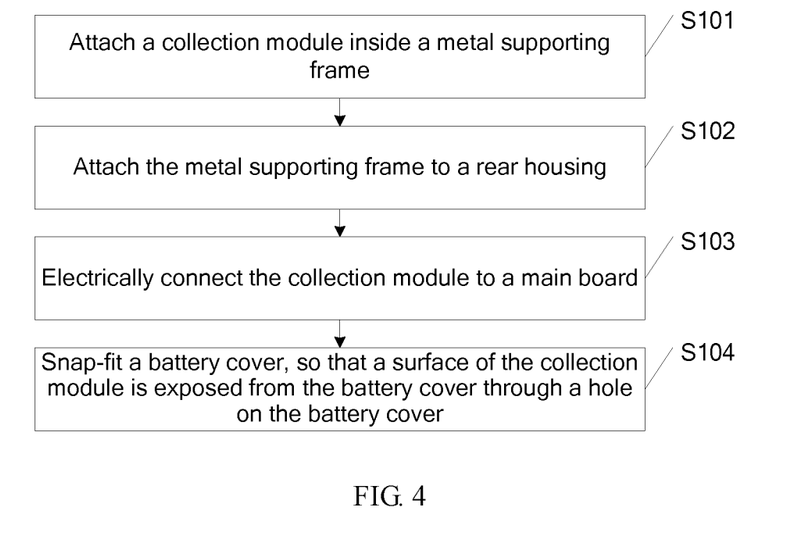
FIG. 4 is a schematic flowchart of a method for assembling a collection module of a terminal according to an embodiment of the present invention.

FIG. 4 is a schematic flowchart of a method for assembling a collection module of a terminal according to an embodiment of the present invention. The terminal includes a front housing, a rear housing and a battery cover that are snap-fitted to the front housing in sequence, a main board assembled onto the front housing, a metal supporting frame, and the collection module. The collection module is configured to collect an external parameter.

The assembly method includes the following steps.

S101: Attach the collection module inside the metal supporting frame.

Specifically, the step includes: placing, through two positioning holes, the collection module onto a positioning fixture for assembling the metal supporting frame; obtaining the metal supporting frame, and peeling off release paper from the metal supporting frame (a pasting material, such as an adhesive, is attached to peripheries of the metal supporting frame, and the pasting material is covered with the release paper before the metal supporting frame is used); and aligning positioning holes on the metal supporting frame to a positioning rod of the fixture, clamping the metal supporting frame onto the fixture, and attaching the metal supporting frame to the collection module. A diameter of the positioning hole may range from 0.7 mm to 1.0 mm (including 0.7 mm and 1.0 mm).

A first hole for accommodating the collection module is provided on the metal supporting frame. During assembly, the collection module is placed into the first hole and attached. A surface of the collection module for collecting an external parameter faces the battery cover.

The metal supporting frame may be a steel supporting frame or a supporting frame made of another metal material. The metal supporting frame has good support. Using the metal supporting frame to support the collection module avoids a problem that a press support failure occurs when the collection module is being used.

S102: Attach the metal supporting frame to the rear housing.

The step includes: placing the rear housing onto a positioning fixture through positioning holes; performing glue dispensing on the rear housing, and checking whether an undesirable case exists in a dispensing path, such as deviation, glue scraped, glue interrupted, and excessive glue; and placing the glue-dispensed rear housing into a positioning fixture for assembling the collection module, suctioning the collection module by using a suction pen, and assembling the collection module to the rear housing by using a positioning rod of the fixture as a reference object.

In an implementation, as shown in FIG. 2, the metal supporting frame 16 may be attached to a side of the rear housing 14 facing the main board 13, that is, the rear housing 14 is located on top of the metal supporting frame 16.

In another implementation, as shown in FIG. 3, the metal supporting frame 26 may be attached to a side of the rear housing 24 facing the battery cover 21, that is, the rear housing 24 is located under the metal supporting frame 26.

S103: Electrically connect the collection module to the main board.

The rear housing and the main board are located on a same side. Therefore, a relatively long FPC is not required when the collection module and the main board are electrically connected by using a BTB connector. Various electronic parts and components of the terminal are arranged on the main board, and the main board is connected to a battery by using a BTB connector. In this way, the collection module is connected to the battery and a control module on the main board, so as to obtain power from the battery, collect an external parameter according to an instruction of the control module, and return the external parameter to the control module.

S104: Snap-fit the battery cover, so that a surface of the collection module is exposed from the battery cover through a hole on the battery cover.

Finally, the battery cover is snap-fitted. A second hole is provided on the battery cover. The surface of the collection module for collecting an external parameter is exposed from the battery cover through the second hole. The collection module may be on a same level as the battery cover or slightly higher than the battery cover. If the rear housing 14 is located on top of the metal supporting frame 16, a third hole is further provided on the rear housing 14, and the collection module is exposed from the terminal through the third hole and the second hole.

In this embodiment, the collection module is assembled onto the rear housing instead of the battery cover. Attaching the collection module and the metal supporting frame to the rear housing belongs to level 2 appearance assembly. This resolves a problem in level 1 appearance assembly that a minor scratch on the battery cover may ruin a fingerprint recognition module. Assembly of the entire collection module is simple and costs little.

Preferably, the battery cover is a non-metal battery cover, for example, a plastic battery cover. With the support of the metal supporting frame, using the plastic battery cover does not lead to the problem that a press support failure occurs when the collection module is being used. Moreover, using the plastic battery cover reduces fabrication costs of the terminal and reduces a weight of the terminal.

Preferably, the collection module includes a fingerprint recognition module, a camera module, an infrared scanning module, and a laser module.

Further, a metal ornament may further be disposed between the collection module and the second hole, that is, the metal ornament is filled between the collection module and the second hole on the battery cover, for supporting the collection module and for decoration.

According to the method for assembling a collection module of a terminal provided in this embodiment of the present invention, the collection module is attached inside the metal supporting frame, and the metal supporting frame is attached to the rear housing of the terminal. In this way, the collection module does not need to be assembled onto the battery cover, and is supported by the metal supporting frame. This resolves the problem that a press support failure occurs when the collection module is being used. Moreover, attaching the collection module and the metal supporting frame to the rear housing belongs to level 2 appearance assembly. This resolves the problem in level 1 appearance assembly that a minor scratch on the battery cover may ruin the fingerprint recognition module. Assembly of the entire collection module is simple and costs little.

It should be noted that, for brief description, the foregoing method embodiments are represented as a series of actions. However, a person skilled in the art should appreciate that the present invention is not limited to the described order of the actions, because according to the present invention, some steps may be performed in other orders or simultaneously. In addition, a person skilled in the art should also appreciate that all the embodiments described in the specification are preferred embodiments, and the related actions and modules are not necessarily mandatory to the present invention.

In the foregoing embodiments, the description of each embodiment has respective focuses. For a part that is not described in detail in an embodiment, reference may be made to related descriptions in other embodiments.

A sequence of the steps of the method in the embodiments of the present invention may be adjusted, and some steps may also be merged or removed according to an actual need.

The modules in the apparatus in the embodiments of the present invention may be combined, divided, and removed according to an actual requirement. A person skilled in the art may merge or combine different embodiments and characteristics of different embodiments described in this specification.

With descriptions of the foregoing embodiments, a person skilled in the art may clearly understand that the present invention may be implemented by hardware, firmware or a combination thereof. When the present invention is implemented by software, the foregoing functions may be stored in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a computer. The following is taken as an example but is not limited: The computer readable medium may include a random access memory (Random Access Memory, RAM), a read-only memory (Read-Only Memory, ROM), an electrically erasable programmable read-only memory (Electrically Erasable Programmable Read-Only Memory, EEPROM), a compact disc read-only memory (Compact Disc Read-Only Memory, CD-ROM) or other optical disk storage, a disk storage medium or other disk storage, or any other medium that can be used to carry or store expected program code in a command or data structure form and can be accessed by a computer. In addition, any connection may be appropriately defined as a computer-readable medium. For example, if software is transmitted from a website, a server or another remote source by using a coaxial cable, an optical fiber/cable, a twisted pair, a digital subscriber line (Digital Subscriber Line, DSL) or wireless technologies such as infrared ray, radio and microwave, the coaxial cable, optical fiber/cable, twisted pair, DSL or wireless technologies such as infrared ray, radio and microwave are included in fixation of a medium to which they belong. For example, a disk (Disk) and disc (disc) used by the present invention includes a compact disc CD, a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer-readable medium.

In summary, the foregoing descriptions are merely examples of embodiments of the present invention, but are not intended to limit the protection scope of the present invention. Any modification, equivalent replacement, or improvement made without departing from the spirit and principle of the present invention shall fall within the protection scope of the present invention.

The invention claimed is:

1. A terminal, comprising:
a front housing;
a main board assembled onto the front housing;
a rear housing having a hole;
a battery cover having a hole, wherein the rear housing and the battery cover are snap-fit onto the front housing;
a metal supporting frame attached to the rear housing; and
a collection circuit attached to an inside of the metal supporting frame and electrically coupled to the main board, wherein a collection surface of the collection circuit is exposed from the hole of the rear housing and the hole of battery cover, wherein the collection circuit is configured to collect an external parameter, and wherein the collection circuit is between the metal supporting frame and the rear housing.

2. The terminal of claim 1, wherein the battery cover comprises a non-metal battery cover.

3. The terminal of claim 1, wherein the metal supporting frame is attached to a side of the rear housing facing the main board.

4. The terminal of claim 1, wherein the metal supporting frame is attached to a side of the rear housing facing the battery cover.

5. The terminal of claim 1, wherein the rear housing comprises a metal ornament located between the collection circuit and the hole.

6. The terminal of claim 1, wherein the collection circuit comprises at least one of a fingerprint recognition circuit, a camera, an infrared scanner, or a laser.

7. The terminal of claim 1, wherein the metal supporting frame comprises a recessed surface forming a container that holds the collection circuit.

8. The terminal of claim 1, further comprising a shielding can and a ground foam between the main board and the metal supporting frame.

9. The terminal of claim 1, further comprising a foam between the collection circuit and the metal supporting frame.

10. The terminal of claim 1, wherein the metal supporting frame extends along an entire width of the terminal.

11. The terminal of claim 1, wherein the collection circuit is located at a center of a width of the terminal.

12. A method for assembling a collection circuit of a terminal, comprising:
attaching the collection circuit to an inside of a metal supporting frame, wherein the collection circuit is configured to collect an external parameter, wherein the terminal further comprises a front housing, a rear housing and a battery cover snap-fitted to the front housing in sequence, and a main board assembled onto the front housing, and wherein the collection circuit is between the metal supporting frame and the rear housing;
attaching the metal supporting frame to the rear housing;
electrically coupling the collection circuit to the main board; and
snap-fitting the battery cover such that a collection surface of the collection circuit is exposed from a hole on the rear housing and a hole on the battery cover.

13. The method of claim 12, wherein the battery cover comprises a non-metal battery cover.

14. The method of claim 12, wherein attaching the metal supporting frame to the rear housing comprises attaching the metal supporting frame to a side of the rear housing facing the main board.

15. The method of claim 12, wherein attaching the metal supporting frame to the rear housing comprises attaching the metal supporting frame to a side of the rear housing facing the battery cover.

16. The method of claim 12, further comprising disposing a metal ornament between the collection circuit and the hole.

17. The method of claim 12, wherein the collection circuit comprises at least one of a fingerprint circuit, a camera, an infrared scanner, or a laser.

* * * * *

UNITED STATES PATENT AND TRADEMARK OFFICE
CERTIFICATE OF CORRECTION

PATENT NO. : 10,757,825 B2  
APPLICATION NO. : 16/090455  
DATED : August 25, 2020  
INVENTOR(S) : Zhimin Wang Page 1 of 1

It is certified that error appears in the above-identified patent and that said Letters Patent is hereby corrected as shown below:

In the Claims

Claim 17, Column 10, Line 46: "of a fingerprint circuit," should read "of a fingerprint recognition circuit,"

Signed and Sealed this  
Sixth Day of October, 2020

Andrei Iancu  
*Director of the United States Patent and Trademark Office*